Nov. 4, 1958 I. BERMAN 2,859,394

FABRICATION OF SEMICONDUCTOR DEVICES

Filed Feb. 27, 1953

INVENTOR
IRVIN BERMAN
BY Paul S. Martin
ATTORNEY

United States Patent Office 2,859,394

Patented Nov. 4, 1958

2,859,394

FABRICATION OF SEMICONDUCTOR DEVICES

Irvin Berman, Swampscott, Mass., assignor to Sylvania Electric Products Inc., a corporation of Massachusetts Application February 27, 1953, Serial No. 339,414

5 Claims. (Cl. 317—236)

The present invention relates to methods of fabricating semiconductor devices such as rectifiers and the like, and to the resulting devices.

In the manufacture of semiconductor diodes, as an example of such devices, a mechanical and electrical connection is usually formed of soft solder to join the semiconductor element to its support. During manufacture of an enclosing glass envelope and during its lifetime of use, this connection or joint may be momentarily subjected to such high temperature as to soften and thereby disturb the solder connection mechanically or alter the electrical properties of the device, or both.

It is a broad object of the present invention to provide a novel method of joining a semiconductor element to a support. In accordance with one aspect of the present invention, there is provided an improved method of mounting a semiconductor element so as to avoid mechanically disturbing the joint and to minimize damage to the electrical properties of semiconductor devices at elevated temperatures used in fabrication of such devices and during their life.

Illustrative of the problems encountered in properly and permanently mounting a semiconductor element, such as a polished and etched "crystal" or die from a diced wafer of germanium, is the manufacture of rectifying contact devices embodying one or more point contact elements in fixed and critical pressure contact with the crystal. In accordance with known practices, the point contact and semiconductor elements are fixed to metallic pins or leads sealed through the wall of a glass envelope. Copending application Serial No. 74,768, filed February 5, 1949, by Ralph Collins, now Patent No. 2,697,805, is drawn to this construction. Usually, the crystal is connected to its supporting lead by a low-melt solder, such as 60—40 tin-lead solder, and thereafter one or both of the leads are sealed within the glass envelope. In the above mentioned Collins application a long supporting wire separates the die of germanium from the seal of that lead through the glass envelope or the lead is sealed through a metal fitting initially sealed to the glass envelope. It is desirable that the cost represented by the separate metal fittings and their assembly to the glass be eliminated in the latter form, and that the substantial length of the other form of construction disclosed by Collins be reduced to the extent that the soft-solder connection of the germanium to its support would soften during sealing of the glass envelope. Moreover, and quite apart from any particular form of construction, it may be expected that under certain circumstances during its long useful life the completed unit may be subjected to such high temperatures as to soften the soft-solder bond to the germanium and thereby disturb the mechanical assembly and change its electrical characteristics. Accordingly the elimination of the soft-solder bond is highly to be desired.

The high temperatures reached in early attempts to substitute hard solder was an immediate source of trouble. The brazed germanium often shattered. This shattering was avoided and at the same time it was demonstrated that the thermal coefficient of expansion of the bonding metal is of controlling importance as a distinct factor separate from the thermal coefficient of the connecting and supporting metal to which the germanium is soldered through the use of antimony as the brazing material.

During the brazing operation, the germanium is subjected to temperatures exceeding its 500° C. annealing temperature. Heating anywhere near that temperature after its preparation has always raised the fear of changing the crystal characteristics. However, my success with antimony demonstrated that while the high temperature may influence the properties somewhat, brazing heat is not necessarily fatal to good germanium rectifier performance. This success with brazing of germanium removes restrictions on the design and fabrication of hermetically sealed glass envelopes for such devices.

Accordingly, it is a further object of the present invention to provide a novel method for the routine and orderly manufacture of semiconductor devices enabling one or more glass-to-metal seals to be formed in relatively close proximity to a semiconductor element.

In accordance with a still further aspect of the present invention, as an advantage separate and apart from the provision of a heat stable connection between a semiconductor element and its support, it has been found that exceptionally good ohmic contact is obtained with bonding materials which, when present in the semiconductor as an impurity, tend to impart the same conductivity type as the semiconductor element being mounted. In the illustrative embodiment in which this aspect of the invention is realized, antimony is used as a high-temperature solder or brazing material. When present as a trace in the semiconductor, antimony imparts n-type properties. Here, antimony as a bonding material facilitates the formation of a highly heat stable and permanent mechanical connection between a metallic support and an n-type semiconductor element. The good ohmic connection that is realized may be attributed to some slight but nevertheless significant alloying of the bonding impurity with the semiconductor element during the formation of the bond. With antimony as the bond, the germanium need not be plated as with copper or rhodium customarily used preparatory to the conventional soldering.

As previously stated, one aspect of this invention relates to realization of the importance of the brazing material in avoiding shattering, as distinct from the supporting metal lead-in that might appear to be the controlling factor. I have found that coin silver can be used successfully as an alternative to antimony in making good bonds between a metal support and germanium, especially when the wire support is of one of the usual iron-nickel-cobalt alloys employed in glass-to-metal sealing. I have also discovered that, despite serious misgivings to the contrary, the high temperatures reached during this bonding operation do not necessarily destroy the semiconductor properties of germanium.

The above objects and further features and advantages of the present invention will be best understood by reference to the following detailed disclosure in which reference is made to the accompanying drawing wherein.

Figures 1, 2:
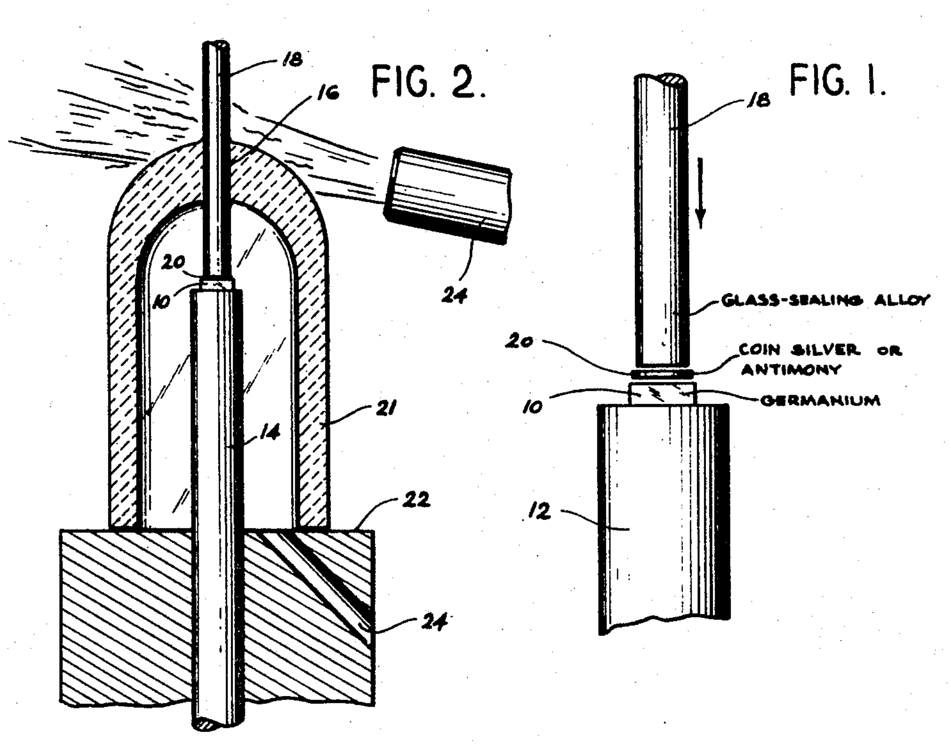
Fig. 1 is a greatly enlarged elevation of parts in the bonding operation of an illustrative embodiment of the present invention.
Fig. 2 is a greatly enlarged elevation schematically showing the incorporation of the bonded semiconductor element of Fig. 1 in a partly completed glass envelope

Referring now specifically to Fig. 1, there is shown an illustrative assembly preparatory to the provision of an area ohmic contact and mechanical bond between a semi-conductor element and a metallic support. While a wire is shown as the support, in certain applications two germanium elements can thus be connected as laminations in making other devices. The process will be described in connection with the fabrication of a diode, using a crystal or chip of highly purified single-crystal germanium 10 customarily used for manufacturing high back voltage point-contact rectifiers. However, it is to be understood that other applications are contemplated within the scope of certain aspects of the present invention.

The semiconductor element 10 is assembled on a support 12 within an inert or preferably a reducing atmosphere such as argon or hydrogen. A length of wire 18 of a glass-sealing alloy such as an iron-nickel-cobalt alloy, is held on germanium element 10, with a layer interposed of a heat stable, high-melt bonding or brazing material 20. The temperature of the entire assembly is raised to the melting point of the bond 20 and thereafter allowed to cool. Gradual cooling is desirable though not essential, in order to avoid producing strains in crystal 10 that might affect its electrical properties.

A bonding layer of either antimony or of a silver-copper alloy of high silver content is exceptionally effective with germanium, especially n-type germanium. While no established figures for the thermal coefficient of germanium were available at the time of my discoveries of these effective bonding materials, present figures for thermal coefficients are:

Germanium—$6 \times 10^{-6}$ inches per °C. (uncertain)
Antimony—8.5 to $10.8 \times 10^{-6}$ inches per °C.
Silver-Copper Alloy — 92.p.c.silver 7.p.c.copper — $6.0 \times 10^{-6}$ inches per °C.

The antimony and silver copper bonds have relatively high melting points as compared to lower melt solders heretofore employed. This greatly facilitates the subsequent incorporation of the bonded semiconductor element into a rectifying-contact device where the bond is exposed to temperatures above the melting point of soft solder. The melting temperature of antimony is in the vicinity of 730° C., while the silver copper alloy melts at approximately 890° C. Both of these materials remain hard at temperatures that would melt soft-solder, and are therefore mechanically stable even where the completed device may be exposed to excessive heat yet is thereafter required to be operative.

As an advantage separate and apart from the provision of a highly heat-stable bond, the use of antimony with germanium of n-type promotes good ohmic connection of the support to the germanium. This may be attributed in part to the partial alloying, or possibly diffusion of the bonding material into the surface of the semiconductor element. A mechanical joint which is also a good ohmic contact is desirable in achieving optimum electrical characteristics of the completed devices.

In Fig. 2 lead 18, carrying germanium die 10 is shown supported on rod 14, and glass tubing 21 is supported on shoulder 22 of the fixture that carries rod 14. Burner 24 may be used for forming a glass-to-metal seal 16 between glass 21 and lead 18. An inert gas may be introduced via passage 24 to preclude gas contamination of the semiconductor 10 while it is hot.

Lead 18 may be of an alloy such as described in U. S. Patent 2,284,155 to Kingston, which has desirable expansion coefficients over a wide range of temperatures and is capable of forming a vacuum-tight seal with a soft commercial glass, such as "Corning G-12". In certain other constructions it may be desirable to employ hard glass, such as commercially sold under the designation "Corning 705 AJ," with a properly matched alloy as of iron, nickel, and cobalt.

Figure 3:
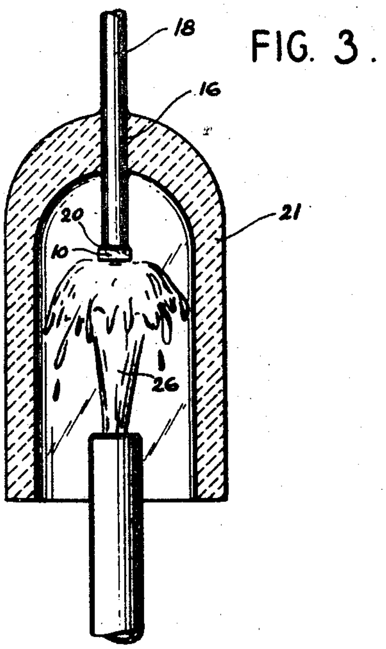
Fig. 3 is a view of a final etching step of the mounted and partially enclosed semiconductor element.
Figure 4:
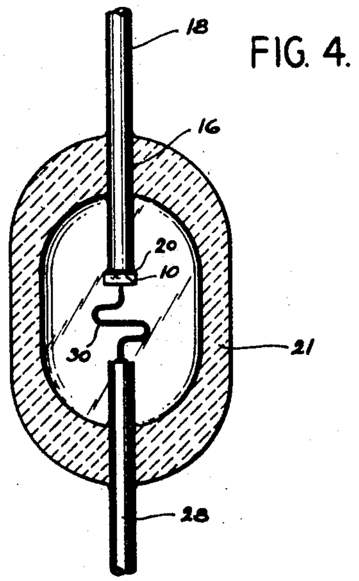
Fig. 4 is a longitudinal sectional view of a completed rectifying contact device.

The assembly of Fig. 2, including the lead 18 sealed in glass wall 21, is treated as shown in Fig. 3 to an etching treatment by a jet 26 of a suitable reagent such as is customarily used. An aqueous solution of hydrofluoric and nitric acids with a trace of copper nitrate is suitable. A diode is completed as shown in Figure 4 by sealing-in another lead 28 of glass-sealing alloy while holding resilient sharp contact 30 against element 10.

The unit formed by the operations illustrated in Figs. 1–4 includes a highly heat stable bond between the germanium element 10 and the supporting lead 18, the bond being substantially unaffected by the formation of the glass-to-metal seals. Additionally, the unit is capable of withstanding relatively high operating temperatures since there is no support, joint or the like which might be adversely affected by these temperatures. In the event that the bonding metal is the donor impurity antimony, there is greater assurance of establishing an ohmic contact to n-type germanium; however, if the silver copper alloy is employed, there is still provided a desired mechanical and conductive connection.

The foregoing disclosure embodying the various aspects of my invention has been directed to germanium; but the invention can also be applied to silicon as a semiconductor of the same crystalline and valence group and of a thermal coefficient ($8.5–10.8 \times 10^{-6}$ inches per degree centigrade), near that of antimony and of coin silver. Various other modifications and applications of the foregoing disclosure will be readily apparent to those skilled in the art and, accordingly, the appended claims should be given such broad interpretation as is consistent with the spirit and scope of the invention:

1. A semiconductor device including point-contact and semiconductor elements supported within a sealed glass envelope, a support of a glass-to-metal sealing alloy for said semiconductor element, and a brazing layer of antimony bonding said semiconductor element and support together.

2. A semiconductor device including point-contact and semiconductor elements supported within a sealed glass envelope, said semiconductor element being of the group consisting of silicon and germanium and being of a certain conductivity type, a metallic support for said semiconductor element, and an impurity layer having a matching thermal coefficient and effective to impart same conductivity type boding said semiconductor element and metallic support together.

3. A semiconductor device including point-contact and semiconductor elements supported within a sealed glass envelope, said semiconductor element being of germanium of n-type conductivity, a support of a glass-to-metal sealing alloy for said germanium element, and an impurity layer of antimony bonding said germanium element and support together.

4. A semiconductor device including a semiconductor element supported on a lead within a sealed glass envelope, a metallic support for said semiconductor element, and a high-melt brazing layer of a thermal coefficient matching that of the semiconductor element bonding said semiconductor element and metallic support together.

5. A semiconductor device including point contact and germanium elements supported in mutual contact within a sealed glass envelope, a support of a glass-to-metal sealing alloy for said semiconductor element, and a layer of a silver-copper alloy bonding said germanium element and support together.

References Cited in the file of this patent

UNITED STATES PATENTS

| | | |
|---|---|---|
| 2,603,693 | Kircher | July 15, 1952 |
| 2,626,985 | Gates | Jan. 27, 1953 |
| 2,644,852 | Dunlap | July 7, 1953 |
| 2,721,965 | Hall | Oct. 25, 1955 |
| 2,747,066 | Brace | May 22, 1956 |